(12) United States Patent
Hohl

(10) Patent No.: US 6,724,198 B2
(45) Date of Patent: Apr. 20, 2004

(54) INDUCTIVE SENSORY APPARATUS

(76) Inventor: G. Burnell Hohl, 21 Driftway La., New Canaan, CT (US) 06840

( * ) Notice: Subject to any disclaimer, the term of this patent is extended or adjusted under 35 U.S.C. 154(b) by 225 days.

(21) Appl. No.: 09/746,197

(22) Filed: Dec. 21, 2000

(65) Prior Publication Data

US 2002/0079908 A1 Jun. 27, 2002

(51) Int. Cl.⁷ .............................................. G01R 27/28
(52) U.S. Cl. ...................................................... 324/654
(58) Field of Search ................................ 324/654, 236, 324/207.17, 166; 382/135

(56) References Cited

U.S. PATENT DOCUMENTS

| | | | |
|---|---|---|---|
| 4,685,678 A | 8/1987 | Frederiksen | |
| 4,855,704 A | 8/1989 | Betz | |
| 4,879,556 A | 11/1989 | Duimel | |
| 4,894,613 A | * | 1/1990 | Tsugawa ............... 324/166 |
| 5,421,694 A | 6/1995 | Baker et al. | |
| 5,598,090 A | 1/1997 | Baker et al. | |
| 5,791,648 A | 8/1998 | Hohl | |
| 5,911,627 A | 6/1999 | Piot et al. | |
| 5,949,325 A | 9/1999 | Devolpi | |
| 6,292,579 B1 | * | 9/2001 | Hutchinson .................. 382/135 |

FOREIGN PATENT DOCUMENTS

EP           0 632 593      * 1/1995

* cited by examiner

*Primary Examiner*—Christine K. Oda
(74) *Attorney, Agent, or Firm*—Patterson, Thuente, Skaar & Christensen, P.A.

(57) ABSTRACT

An inductive sensory system generally includes a sense inductor, a reference sense inductor, an oscillator, a feedback control loop, and a comparator. The oscillator is connectable to both the sense inductor and the reference sense inductor. Upon the oscillator being connected to the reference sense inductor, the feedback control loop establishes a fixed reference level. Upon the sense inductor being connected to the oscillator, the comparator compares the state of the sense inductor against a threshold that is derived from the fixed reference level to determine the change in inductance of the sense inductor.

20 Claims, 8 Drawing Sheets

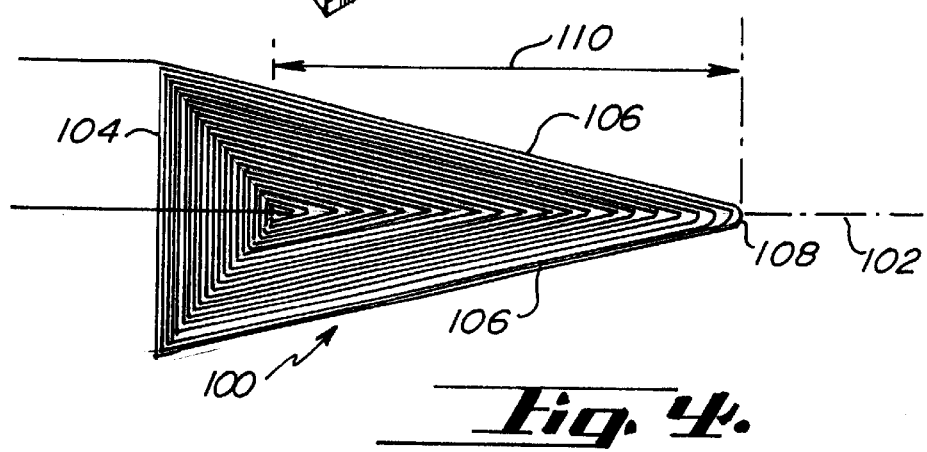

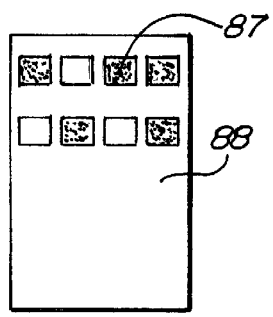
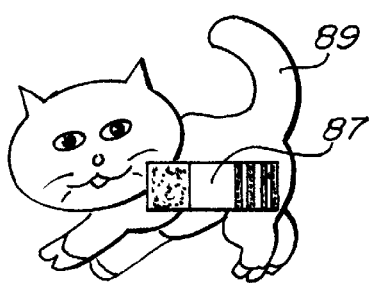
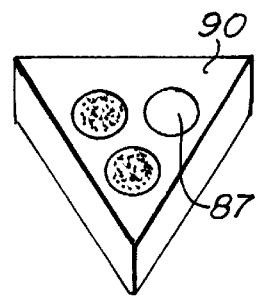
*Fig. 7A.*  *Fig. 7B.*  *Fig. 7C.*
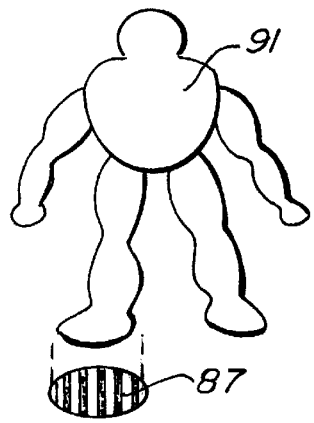
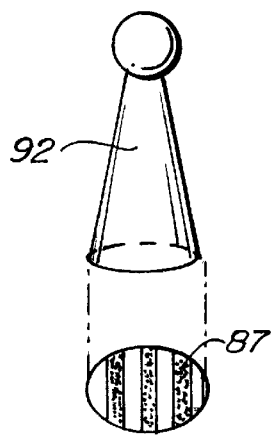
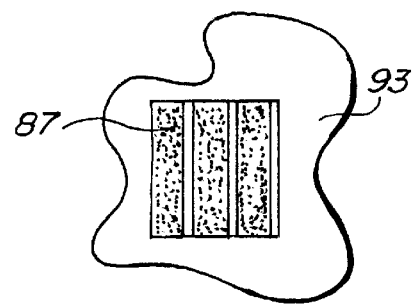
*Fig. 7D.*  *Fig. 7E.*  *Fig. 7F.*
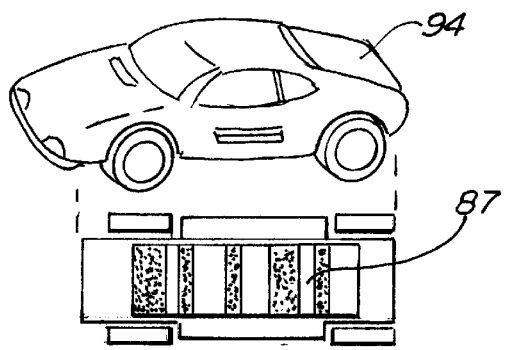
*Fig. 7G.*

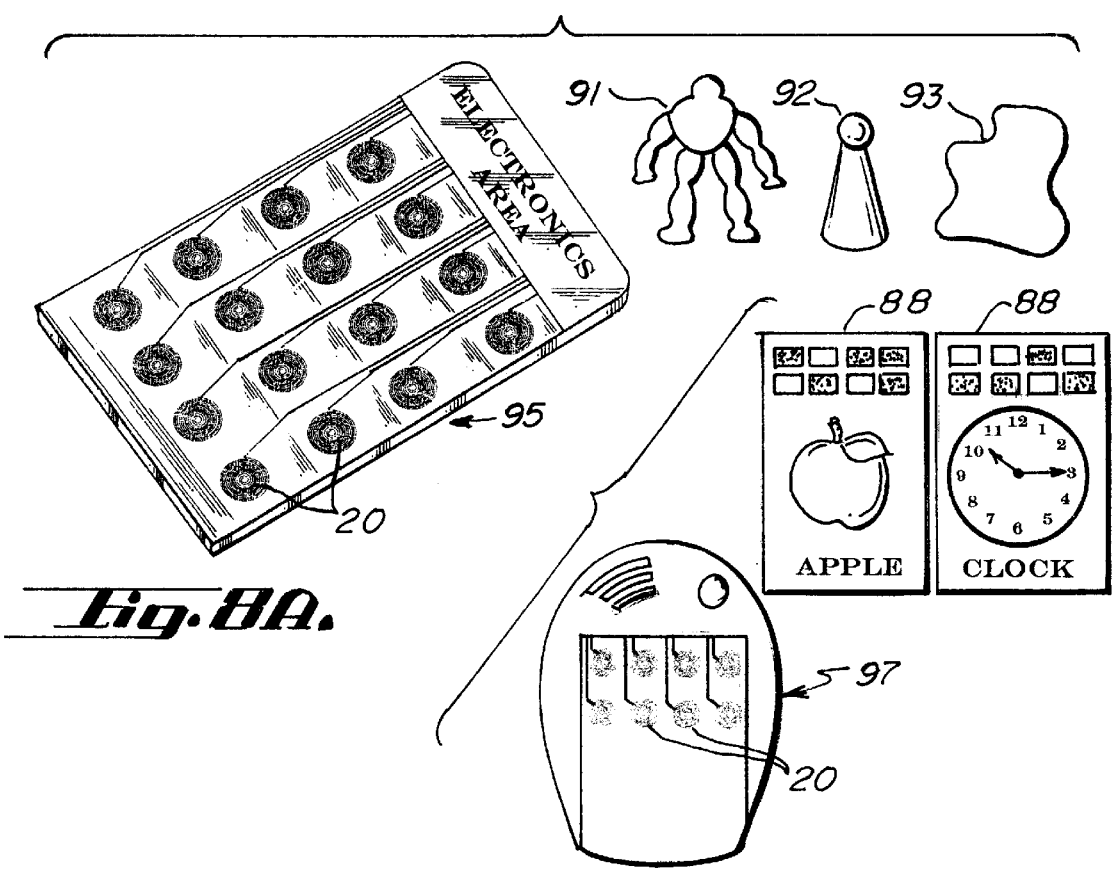
Fig. 8A.
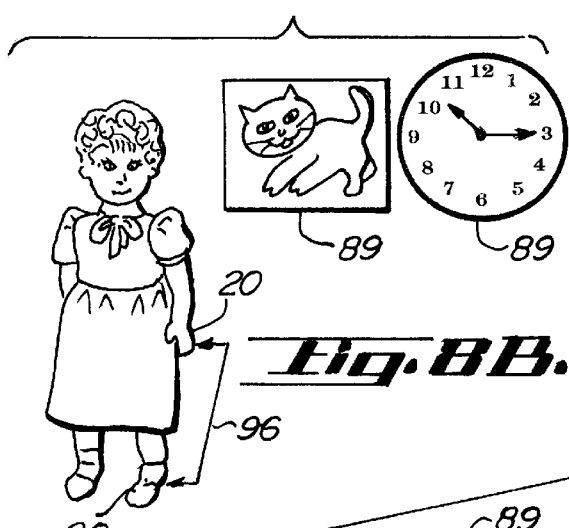
Fig. 8B.
Fig. 8C.
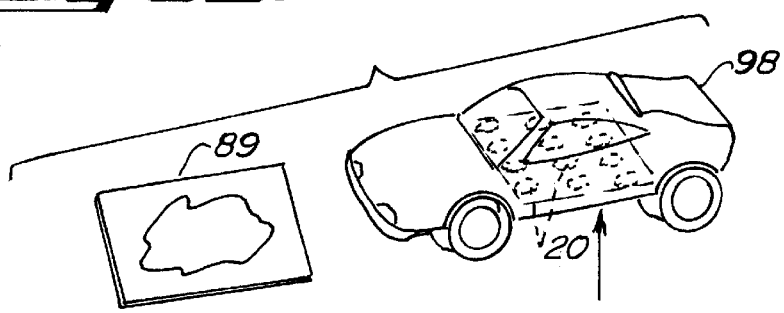
Fig. 8D.

INDUCTIVE SENSORY APPARATUS

FIELD OF THE INVENTION

The present invention relates to inductive sensors and, more particularly, to an inductive sensor that determines the identity and position of a conductive pattern, or object, in proximity to the sensor, and that is additionally substantially temperature and component tolerance independent.

BACKGROUND OF THE INVENTION

A sensor that determines the identity and position of a conductive pattern or object is generally known as a "presence sensor". Most presence sensors use reed switches and magnets to track the motion of magnetic elements. These devices usually have one reed switch placed under a plurality of discrete positions on the sensor. When an object with a magnet integrated therein is placed in a particular position, the reed switch is activated and remains closed until the object is removed. In this way, the position of the objects placed on the sensor may be determined and tracked.

However, such devices cannot determine the identities of the objects placed upon the surface of the sensor. Only when specific, predefined objects are placed in predefined positions on the sensory surface can such devices determine the identities of the objects placed upon the sensor. Furthermore, such devices are often inaccurate if the objects are moved quickly, or if two objects occupy the same position on a sensory surface.

In moving away from a standard reed switch/magnetic element presence sensor, presence sensors utilizing a change in the inductance of sense coils to indicate the location and/or identity of an object have been developed. Such a presence sensor may be found in U.S. Pat. No. 5,791,648 (hereafter, the '648 patent), which is entitled "Inductive Sensory Apparatus" and is hereby incorporated by reference. The inductive sensory apparatus of the '648 patent utilizes a matrix of coils embedded in the surface of the apparatus. A multiplexor selects the individual coils by connecting them sequentially to an LC oscillator where they act as the inductors in the oscillator circuit. Changes in the inductance of any coil results in corresponding changes in the amplitude and the frequency of oscillation of the oscillator circuit. The oscillation amplitude of each coil is compared against at least one voltage threshold by an amplitude comparator. The amplitude comparator is sampled by a microcontroller to detect the inductance of each coil. The microcontroller then assigns a value to each coil that is determined by the inductance of the coil. By assigning a value to each individual coil, the microcontroller determines the code that uniquely identifies the object placed next to the inductive sensor apparatus.

While the inductive sensory apparatus of the '648 patent is a significant improvement over a standard reed switch/magnetic element presence sensor, it has its own limitations. Specifically, the LC oscillator of the inductive sensory apparatus, which is used to detect changes in the self inductance of the sensory coils near a conductive pattern, is subject to amplitude and frequency variations due to changes in temperature and component tolerances. This results in a shift in the quiescent operating amplitude of the oscillator. The shift in the quiescent operating amplitude limits the ability of the inductive sensory apparatus to detect small variations in amplitude, caused by the proximity of conductive material to the inductive sensory apparatus.

Still another limitation of the inductive sensory apparatus of the '648 patent is that it detects only the presence or absence of conductive material in close proximity to each of the sense coils, which limits the number of objects that can be detected with a given number of sense coils, due to the use of binary coded conductive patterns. Yet another limitation of the inductive sensory apparatus of the '648 patent is that while it can detect the presence or discrete location of a conductive object, it cannot detect the exact position or displacement of such an object.

In view of the above, there is a need for an electronic inductive sensory apparatus that incorporates improved sensitivity to detect objects encoded with a conductive pattern, or to detect the presence or location of a conductive object at greater sensing distances for a given coil size. Further, there is a need for an electronic inductive sensory apparatus that has improved tolerance and stability by automatically compensating for variations in temperature and component tolerances. Further still, there is a need for an electronic inductive sensory apparatus that can detect an increased number of objects with a given number of sense coils, through the detection of multiple conductive states. There is also a need for an electronic inductive sensory apparatus that can detect the position or displacement of an object.

SUMMARY OF THE INVENTION

The needs described above are in large measure met by the inductive sensory system of the present invention. The inductive sensory system generally comprises a sense inductor, a reference sense inductor, an oscillator, a feedback control loop, and a comparator. The oscillator is connectable to both the sense inductor and the reference sense inductor. Upon the oscillator being connected to the reference sense inductor, the feedback control loop establishes a fixed reference level. Upon the sense inductor being connected to the oscillator, the comparator compares the state of the sense inductor against a threshold that is derived from the fixed reference level to determine the change in inductance of the sense inductor.

The inductive sensory system further includes a processor that selects between the sense inductor and the reference sense inductor. The feedback control loop maintains the fixed reference level substantially independently of ambient temperature variations, supply voltage variations, and component tolerance variations. The sense inductor may be of various configurations including a flat, round or square sense coil and a triangularly-shaped or rectangularly-shaped sense coil. The sense inductors may be incorporated into a gameboard, doll or book, or a template positioned beneath a book. to detect conductive spots within pages of the book.

The inductive sensory system may be configured for detection of multiple conductive states. In doing so, the reference level established by the feedback control loop is used to derive at least two thresholds for comparison. The different thresholds allow for detection of different conductive levels in an object. These different conductive levels may be detected by the system regardless of the orientation of the object at a given sensing distance. The objects are preferably encoded with a printed pattern or different materials that have different conductivities. Specifically, the inductive sensory system may be used to detect trinary patterns of objects encoded with three distinct conductive states, e.g., covered, uncovered, partially covered with conductive material.

The inductive sensory system may employ triangular or rectangular shaped coils to create a position sensor that may be incorporated into an attenuator or slide controller. As conductive material is moved along the coil axis a voltage is generated that is linearly proportional to the displacement of the conductive object. This voltage or its digital representation may be used to control a variety of mechanical devices, audio volume, temperature, etc.

BRIEF DESCRIPTION OF THE DRAWINGS

FIG. 2, comprising

FIG. 3 diagrams a book with coil template, showing offset conductive spots used for page detection.

FIG. 4 depicts the construction of a triangular-shaped sense coil that may be utilized with the inductive sensory apparatus of the present invention to detect the displacement of a conductive object.

FIGS. 7A–G depicts various conductively coded objects.

FIGS. 8A–D depicts various objects with embedded sense coils.

DETAILED DESCRIPTION OF THE PREFERRED EMBODIMENTS

The inductive sensory apparatus of the present invention provides for increased sensitivity allowing it to detect objects encoded with a conductive pattern at greater sensing distances, provides for enhanced tolerance and stability by automatically compensating for variations in temperature and component tolerances, and provides for an increase in the number of conductive objects detectable through detection of multiple conductive states.

I. Inductive Sensory Apparatus

Figure 1:
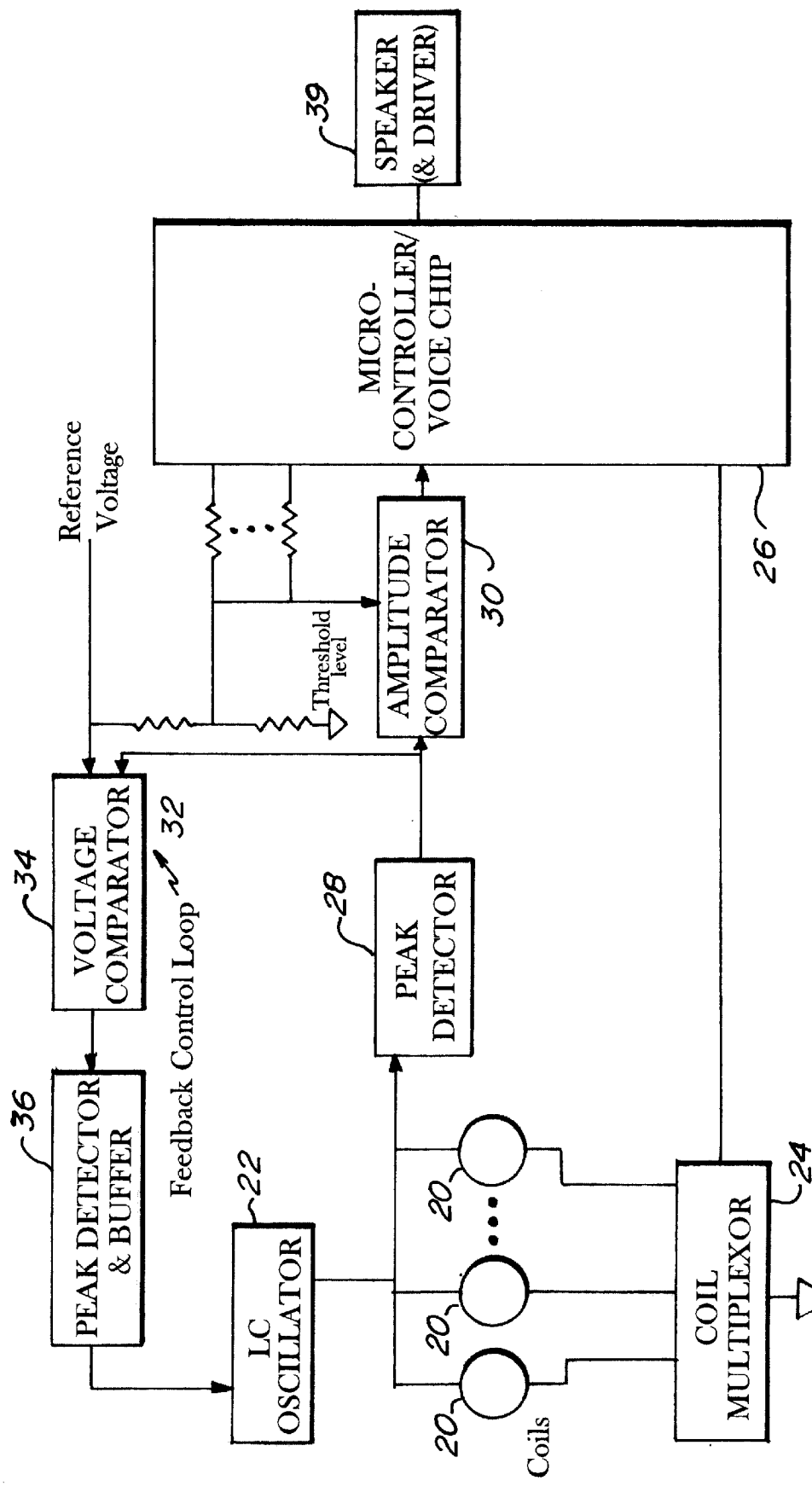
FIG. 1 is a block diagram of the inductive sensory apparatus of the present invention.
Figure 2A:
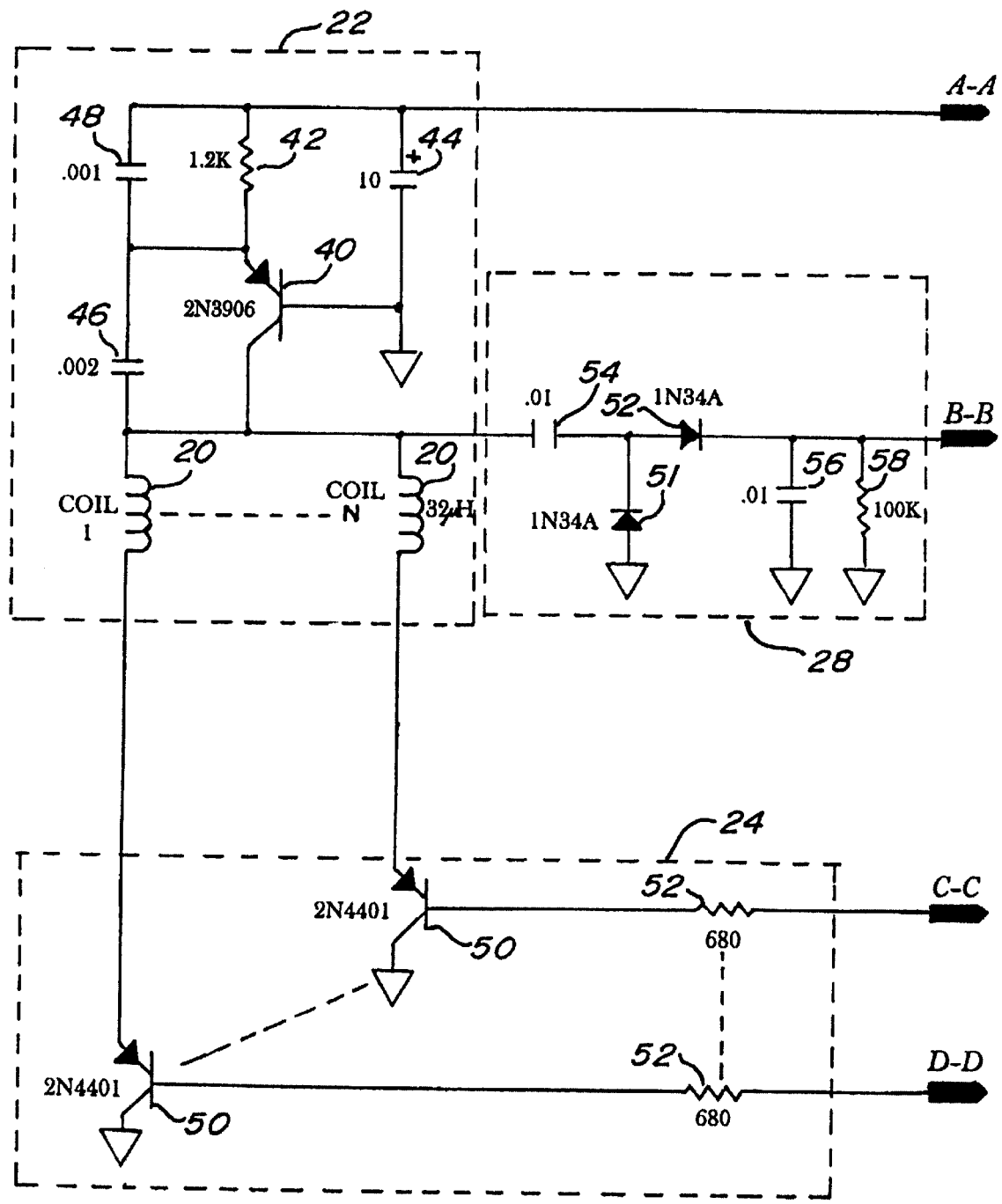
FIGS. 2A and 2B, is a detailed electronic circuit diagram implementing the inductive sensory apparatus of FIG. 1.
Figure 2B:
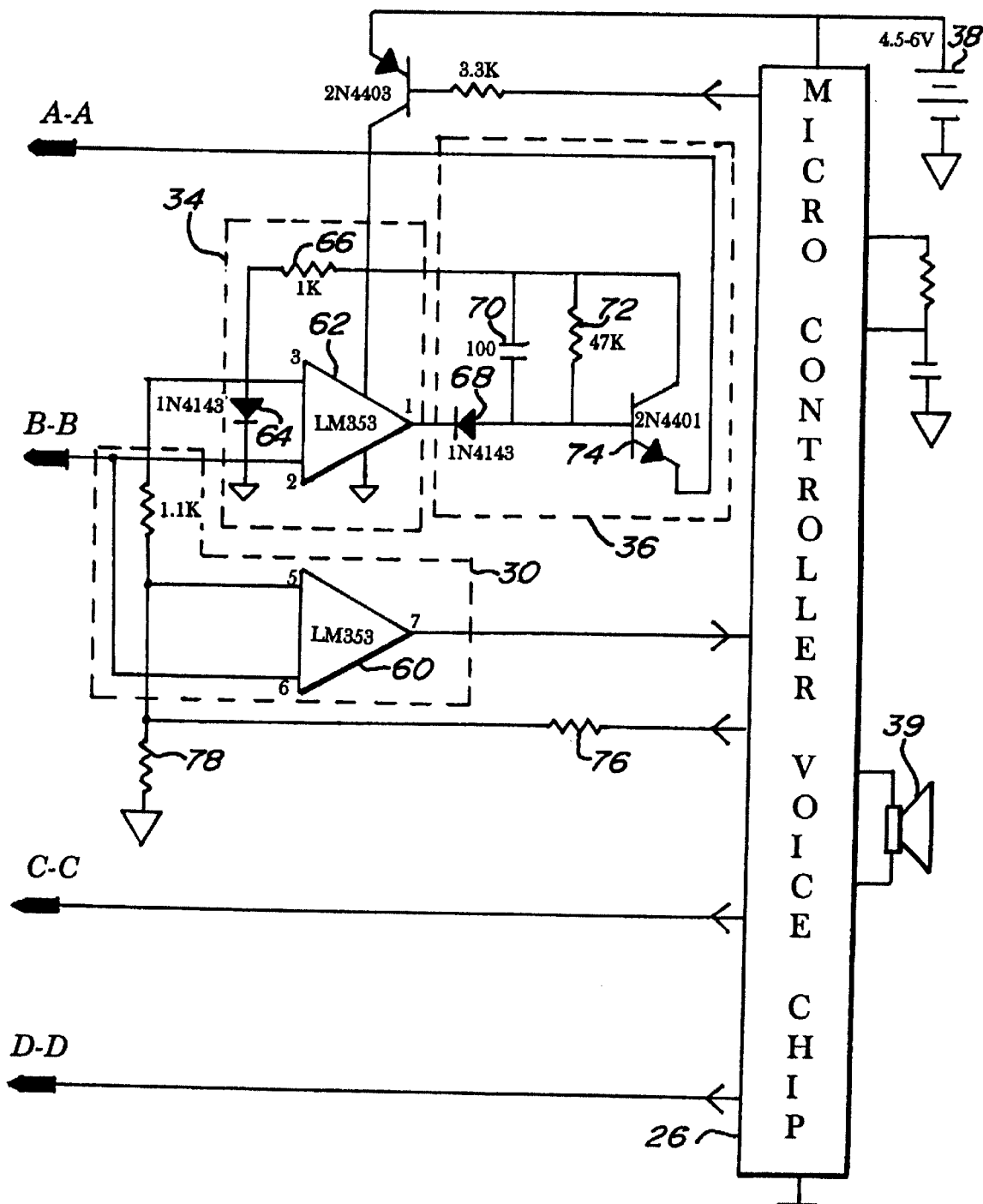

Referring to FIGS. 1 and 2, inductive sensory apparatus 10 of the present invention is depicted. As shown, inductive sensory apparatus 10 generally includes a plurality of coils 20, each of which forms part of an LC oscillator 22 and each of which is connected to a coil multiplexor 24. The operation of coil multiplexor 24 is under direction of a microcontroller 26, which may include a voice chip. The output of LC oscillator 22 is directed to a peak detector 28 whose output is directed to an amplitude comparator 30 and to a feedback control loop 32. The feedback control loop is generally comprised of a voltage comparator 34 and a peak detector/buffer 36, the output of which is directed back to LC oscillator 22. A battery 38 preferably powers inductive sensory apparatus 10. A speaker 39 may be connected to microcontroller 26 for activation by the voice chip.

Inductive sensory apparatus 10 automatically adjusts the voltage driving LC oscillator 22, by means of a feedback control loop, to keep the peak oscillator amplitude fixed and to compensate for variations in oscillation amplitude due to supply voltage or temperature changes, or component tolerances. This eliminates the need for a voltage regulator in the circuit and increases the sensitivity and dynamic range of inductive sensory apparatus 10 for a given sense coil 20 size, and thus, the ability of inductive sensory apparatus 10 to detect multiple conductive states.

The number of sense coils 20 depends upon the number of bits used in the code patterns to be detected (which is dictated by the total number of code patterns to be detected and the type of coding used, i.e., binary, trinary, etc.) or upon the number of discrete locations where the presence of a conductive object is to be detected. The size of the coils depends upon the sensing distance. Sensing distance, however, is also dependent upon the conductivity of the conductive pattern being detected. Silver, for example, can be detected at a greater sensing distance than copper or aluminum.

In order to keep multi-bit code patterns a reasonable size, the flat sensor coils are usually square or round, and typically range in size from about 0.5" to about 0.88". Coils may be etched onto a PC board or printed onto a non-absorbing substrate, using conductive ink. A 0.75" square coil typically consists of fourteen turns. Sensing distances vary from around 0.06" using small coils (0.5") up to around 0.25" with 0.88" square coils. Larger coils, greater than 1", usually are used for the detection of more than two multiple conductive states to provide sufficient sensor dynamic range at a reasonable sensing distance.

Coils 20 may be arranged on the surface of apparatus 10 in any pattern. However, in the preferred embodiment, coils 20 are arranged linearly in rows and columns in a checkerboard pattern. In an alternative embodiment, coils 20 are arranged in a series of concentric circles, which permit conductive patterns to be detected even when rotated over the sense coils. The only requirement as to the arrangement of coils 20 on the surface of apparatus 10 is that the pattern of coils 20 must match the pattern of conductive elements on the object to be read by inductive sensory apparatus 10.

Each of coils 20, at certain times in operation, acts as the inductor for LC oscillator 22. As shown in the circuit diagram of FIG. 2, LC oscillator 22 is of a standard configuration incorporating a bipolar transistor 40, a bias resistor 42, bypass capacitor 44, as well as first and second capacitors 46 and 48. The base of transistor 40 is tied to ground.

Coil multiplexor 24 is comprised of a plurality of bipolar transistors 50, i.e., one per each sense coil 20, each of whose emitter is tied to ground, as well as a resistor 52 connected between microcontroller 26 and the base of each transistor 50. Alternatively, coil multiplexor 24 may comprise an open collector chip, e.g., a 74LS156 (octal) or 74LS05(hex). Under direction of microcontroller 26, coil multiplexor 24 operates to ground one of sense coils 20 at a time. Grounding sense coil 20 effectively connects sense coil 20 to LC oscillator 22 by creating a ground path through sense coil 20, thus enabling LC oscillator 22.

Microcontroller 26 is preferably a combination microcontroller and voice chip. Alternatively, the voice chip may be eliminated from microcontroller 26, or a discrete logic controller or ASIC chip may be used in place of microcontroller 26. Microcontroller 26 is utilized to sequence through the various sense coils 20 so that the state of each sense coil 20 may be determined.

Peak detector 28 is generally comprised of first and second diodes 51, 52, first and second capacitors 54, 56, and resistor 58. Peak detector 28 operates to clamp the negative excursion of the output of LC oscillator 22 to ground and to convert the positive peak amplitude of LC oscillator 22 to a DC level that can be used for comparison by voltage comparator 34.

Amplitude comparator 30 is preferably comprised of an operational amplifier 60 and is used to detect changes in amplitude of oscillation of LC oscillator 22; the change in amplitude corresponds to a change in inductance of sense coil 20 indicating the conductivity of material near sense coil 20.

Feedback loop 32, as indicated above, is generally comprised of voltage comparator 34 and peak detector/buffer 36.

Voltage comparator 34 is preferably comprised of an operational amplifier 62, a diode 64 whose forward voltage drop is used to establish a 700 mV reference voltage, and a resistor 66, which biases the reference diode 64. Voltage comparator 34 is used to compare the DC level output of LC oscillator 22 to the reference voltage. The output of op-amp 62 is fed to peak detector/buffer 36 which is generally comprised of diode 68, capacitor 70, resistor 72 and bipolar transistor 74. The output of peak detector/buffer 36 is supplied as the drive voltage to LC oscillator 22.

In operation, microcontroller 26 dynamically selects any sense coil 20, which is not covered with conductive material, to use as a reference coil and connects it to the oscillator circuitry by grounding it through coil multiplexor 24, e.g., bipolar transistor 50, to establish the required drive level for LC oscillator 22. The nominal drive level for LC oscillator 22 is set, by selection of the emitter resistor, i.e., resistor 42, to be midway through the dynamic range of feedback control loop 32. The peak sense coil amplitude is clamped by feedback control loop to a fixed reference voltage, e.g., 700 mV, so that the other sense coils 20 may be momentarily switched into LC oscillator 22 by microcontroller 26 and compared against the reference coil, which is not affected by the proximity of conductive material. This results in greater sensor detection sensitivity and dynamic range, without circuit adjustments, increasing the sensing distance for a given coil size.

When conductive material is in close proximity to any sense coil 20, the inductance and oscillation of the respective sense coil 20 decreases. This change in amplitude is detected by amplitude comparator 30 as it compares the oscillation amplitude against two or more reference voltages. The two or more reference voltages are derived from the fixed 700 mV reference that is provided by diode 64 and are dynamically selected by microcontroller 26 by changing the voltage divider, established with a first resistor 78 and second resistor 76, (and thus, the switching threshold) at the positive input of amplitude comparator 30. If amplitude comparator indicates that the reference coil amplitude is below the first threshold thereby implying that conductive material is covering or has been placed near the selected reference sense coil 20, microcontroller 26 operates through its software to dynamically select a new uncovered sense coil 20 to use as a reference.

With a reference sense coil 20 established and the drive level for LC oscillator 22 set, microcontroller 26 operates to sequence through the remaining sense coils 20 comparing the amplitude of each sense coil 20 to at least the first threshold and, if desired, further thresholds. In the instance of comparing the amplitude of each sense coil 20 to only a first threshold, inductive sensory apparatus 10 may be used to produce a binary code that corresponds to an identification code printed on an object or a location of a conductive object that is within an area covered by sense coils 20. For example, each sense coil 20 may be assigned a value of zero (0) by microcontroller 26 if there is no change in inductance of sense coil 20 and, correspondingly, no change in amplitude detected by amplitude comparator 30, and each sense coil 20 may be assigned a value of one (1) by microcontroller 26 if there is any significant change in the inductance of sense coil 20 and, correspondingly, a change in amplitude detected by amplitude comparator 30. Thereby, microcontroller 26 is able to produce a binary code by sampling the matrix of sense coils 20.

In the instance of comparing the amplitude of each sense coil 20 to more than one threshold, inductive sensory apparatus 10 may be used to detect multiple conductive states. Specifically, each sense coil 20 may detect two or more conductive states of an object rather than simply detecting whether a conductive material is or is not present. Intermediate conductive states are coded on an object by the use of printed striped conductive ink patterns, for example, where the spacing and width of the stripes varies the conductivity by varying the area of corresponding sense coils that is covered with conductive material, or by embedding different materials that exhibit different conductivities, e.g., copper and silver, in an object. The ability to detect a plurality of conductive states with a single coil is desirable when objects are either too small to accommodate detection with multiple sense coils or when one does not want to restrict the orientation of an object, as is usually required when detecting a multi-cell conductive code pattern.

Further, the ability to detect a plurality of conductive states enables inductive sensory apparatus 10 to read trinary conductive patterns and produce a corresponding trinary code. For example: (1) microcontroller 26 may assign each of sense coils a zero (0) if there is no change in inductance of sense coil 20 (sense coil 20 is uncovered) and, correspondingly, no change in amplitude detected by amplitude comparator 30; (2) microcontroller 26 may assign each of sense coils 20 a one (1) if there is a change in inductance of sense coil 20 (sense coil 20 is partially covered) and, correspondingly, there is a change in amplitude detected by amplitude comparator 30, i.e., the amplitude has fallen below a first threshold; and (3) microcontroller 26 may assign each of sense coils 20 a two (2) if there is a change in the inductance of sense coil 20 (sense coil is completely covered) and, correspondingly, there is a change in amplitude detected by amplitude comparator 30, i.e., the amplitude has fallen below a second threshold.

When using trinary coding, the number of objects that can be detected with a given number of sense coils 20 increases dramatically. For example, using six ¾ inch flat, square sense coils 20 in a sensing area of 2.25 inches by 1.5 inches, 63 binary codes are capable of being represented. However, when using trinary coding with the same six sense coils 20, 728 unique codes can be detected. It should be noted, however, that trinary coding increases the required positional accuracy in the placement of printed code patterns over inductive sensory apparatus 10.

Inductive sensory apparatus 10, as described above, may be used in numerous applications. These applications include but are not limited to the identification of cards, the detection of different game pieces at various locations on a game board, the detection of an object by touching it with the hand of a doll or stuffed toy, and the identification of molded objects when placed in any orientation on a sensory surface. These detections may then be used to trigger audio responses that are produced via the voice chip of microcontroller 26 and speaker 39. For example, the hand of a doll or stuffed toy may be designed to contain a conductive material. The hand may then be placed over a word or picture of a book that is placed upon a template containing inductive sensory apparatus 10, which includes a plurality of flat sense coils 20 that are printed on a flex circuit or etched on a PC board. Upon the inductive sensory apparatus 10 detecting the hand, a word or phrase corresponding to the selected word or picture in the book is produced. Alternatively, inductive sensory apparatus 10 may be incorporated into the book itself. Note that in such a situation, certain sense coils 20 of inductive sensory apparatus 10 may be used to detect the location of the doll's hand, pointing to a given word on a page of the book, while still other sense coils 20 are used to detect the identity of the book, as well as the page selected (the hand, the page, the book, etc., are each coded differently with conductive material).

Software reads the state of several book coils to detected a book ID code printed on the last page or back cover of the book. It reads the state of the offset page coils, where the number of page coils covered with conductive spots on successive pages indicates the page selected. The software then indexes a stored table of word/phrase voice memory addresses for each book and selects a subset of those addresses corresponding to the selected page for the selected book. It then detects the individual word coil covered by the doll's hand, using that information as an index to select a particular voice address, within the set of possible voice addresses for the selected page, which corresponds to the individual word or picture that is pointed to on the selected page.

With respect to detecting the page of a book, there exists prior art related to various mechanical and electromechanical manners of detection. However, these manners of detection generally require electrical connections to pages and/or cut-out areas in the pages (e.g., for optical detection). Inductive sensory apparatus 10 may be used without the prior art requirements; as shown in FIG. 3 each page 80 of a book may be printed with a single conductive spot 82, offset on each page 80, such that the spots 82 on overlapping pages 80 each cover their respective page coil 84 in the sensory coil pattern. In essence the tagging of each page 80 can be accomplished with a single hidden conductive spot 82, and thus, the detection of the pages 80 can appear magical to the user. Word coils 86 may then be used to detect various words 88 on pages 80. Note that the electronics of the inductive sensory apparatus 10 are maintained proximate to coils 84 and 86 in the back cover of the book or in a template to be placed beneath the book.

Specific depictions of conductively coded objects, each presenting a code pattern 87 that may be detected with inductive sensory apparatus 10, are shown in FIG. 7, with FIG. 7A depicting a conductively coded play card 88, FIG. 7B depicting a conductively coded picture 89, FIG. 7C depicting a conductively coded molded shape 90, FIG. 7D depicting a conductively coded molded FIG. 91, FIG. 7E depicting a conductively coded game piece 92, FIG. 7F depicting a conductively coded puzzle piece 93, and FIG. 7G depicting a conductively coded toy vehicle 94. Specific depictions of objects with embedded sense coils 20 of inductive sensory apparatus 10 that can be used to detect conductively coded objects are shown in FIG. 8, with FIG. 8A depicting a game board 95 with a plurality of embedded sense coils 20 for detecting conductively coded objects, e.g., molded FIG. 91, game piece 92, puzzle piece 93, FIG. 8B depicting a doll 96 with sense coil 20 embedded in the hand or foot of the doll 96 for detecting conductively coded objects, e.g., pictures 89, FIG. 8C depicting a card reader 97 with embedded sense coils 20 for reading conductively coded objects, e.g., cards 88, and FIG. 8D depicting a toy vehicle chassis 98 with embedded sense coils 20 for detecting coded objects, e.g., picture 89. Other conductively coded objects and objects with embedded sense coils. may be used without departing from the spirit or scope of the invention.

II. Inductive Sensory Apparatus—Position Sensing

Referring to FIG. 4, a flat, triangular sense coil 100 that may be utilized with inductive sensory apparatus 10, in place of sense coil 20, is depicted. Triangular sense coil 100 is preferably an isosceles or equilateral triangle with an imaginary axis 102,. wherein imaginary axis 102 is defined as the bisector of an angle of the triangle that is perpendicular to the opposite side 104 and connects to the midpoint of opposite side 104. Thus, imaginary axis 102 divides triangular sense coil 100 into two symmetrical halves 106.

If triangular sense coil 100 is connected to inductive sensory apparatus 10 in place of sense coil 20, and a piece of conductive material that is wider than the maximum width of triangular sense coil 100 but shorter than its length is moved along imaginary axis 102 of triangular sense coil 100 and in close proximity to triangular sense coil 100, then the peak detected voltage from LC oscillator 22 produced by inductive sensory apparatus 10 is linearly proportional to the displacement of the conductive material along imaginary axis 102 of triangular sense coil 100. In other words, triangular sense coil 100 can be used to produce a voltage that is proportional to the position of a conductive object along the imaginary axis 102 of triangular sense coil 100 and at a fixed distance from the flat plane of triangular sense coil 100.

This voltage may then be amplified and used directly by inductive sensory apparatus 10 as an analog control voltage, or it may be digitized and used with a software lookup table within microcontroller 26 to determine the exact position of the conductive object. When conductive material is positioned near the apex 108 of triangular sense coil 100 it covers a very small coil area, while as it is moved along imaginary axis 102 of triangular sense coil 100 it covers an increasingly larger area with more coil turns. This causes the self-inductance of the triangular sense coil 100 to decrease as the conductive material bridges the field across coil turns, and the change in inductance is linear as long as the triangular sense coil 100 is symmetrical about imaginary axis 102. However, when the conductive object reaches the area of triangular sense coil 100 near opposite side 104, where the coil turns are perpendicular to imaginary axis 102, the field bridging effect decreases and the inductance of triangular sense coil 100 may actually begin to increase. Therefore, the sensing area to detect linear displacement extends from apex 108 of triangular sense coil 100, along imaginary axis 102, to the edge of the area where the coil turns run perpendicular to imaginary axis 102, said edge designated by line 110.

Figure 6:
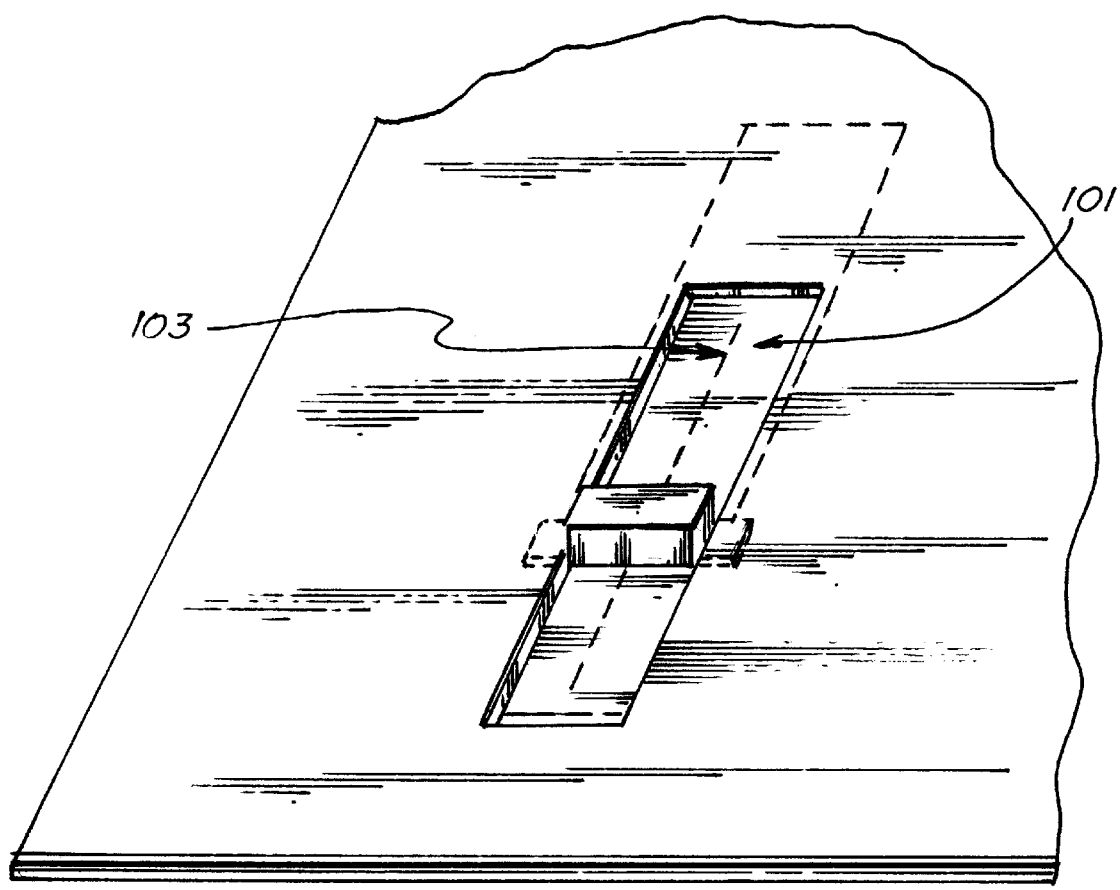
FIG. 6 depicts a sealed conductive attenuator with a rectangular sense coil.

In an alternative embodiment of a displacement sensor, a rectangular coil 101, which is symmetrical about an axis 103, may be connected to inductive sensory apparatus 10, see FIG. 6. In this case, a flat sheet of conductive material when drawn across the rectangular coil, in the direction of its axis, covers an increasingly larger area of the coil and also produces a sensor control voltage that a linearly proportional to the displacement of the conductive sheet along the coil axis.

The ability to detect the displacement of a conductive object with inductive sensory apparatus 10, using triangular sense coil 100 or alternatively, with a rectangular sense coil, has application in position sensing, particularly, for use in controls used in toxic or contaminated environments. Because physical contact between conductive material and the sense coil is not required, a control mechanism utilizing the inductive sensory apparatus 10 is designed to operate in a completely sealed enclosure, suitable for such a toxic or contaminated environment, and which can be adjusted externally from outside the sealed enclosure. One specific application is that of a sealed attenuator, or slide controller, which might be used for volume control, speed adjustment, etc.

Figure 5A:
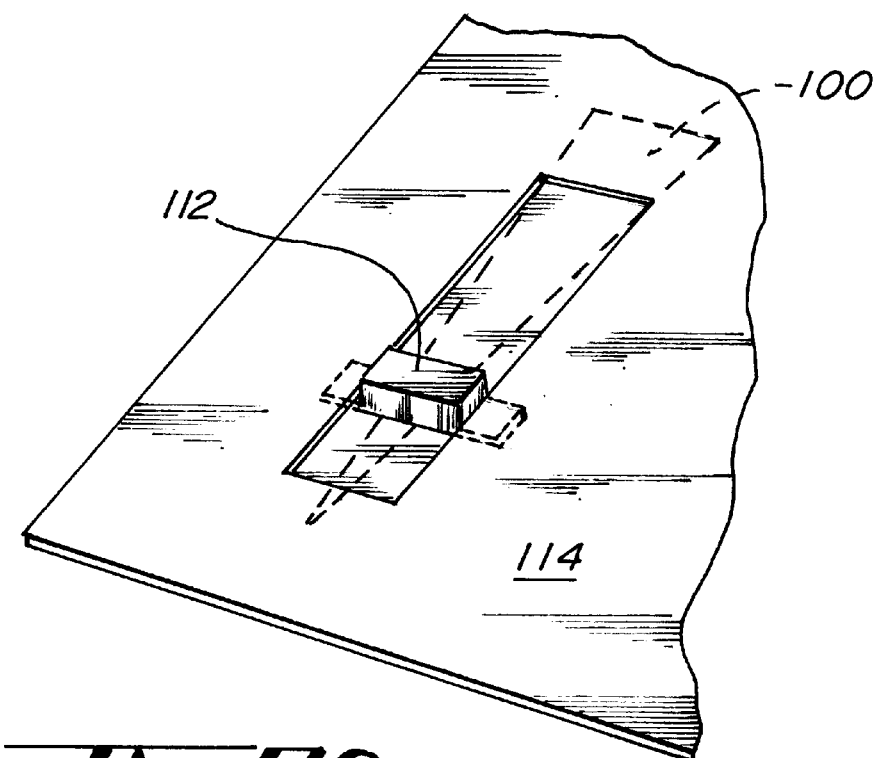
FIG. 5 shows the construction of a sealed conductive attenuator.
Figure 5B:
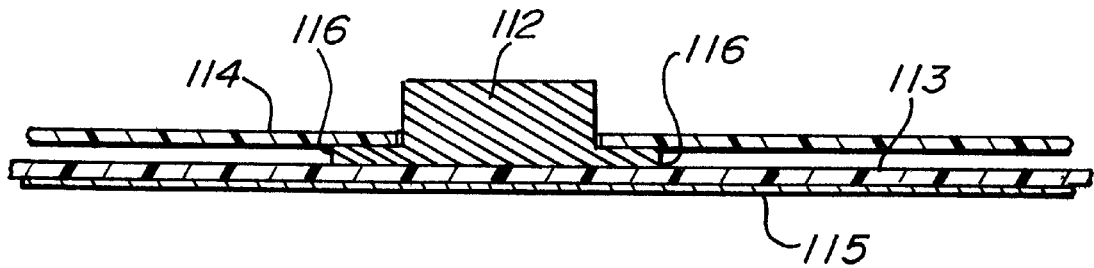

The sealed attenuator is constructed, as shown in FIGS. 5A and 5B, using inductive sensory apparatus 10 with triangular sense coil(s) 100 with a sliding conductive bar 112 that moves over triangular sense coil(s) 100, but is separated from coil(s) 100 by a sealed housing cover 113. The plane 115 of triangular sense coil 100, wherein sense coil 100 is printed on a substrate material or etched on a PC board, can be seen in the side view of the attenuator, FIG. 5B. As can also be seen in the side view of the attenuator, sliding conductive bar 112 preferably includes side tabs 116 that allow bar 112 to slide below a control panel cover 114 while at the same time being held captive by cover 114. As the position of the attenuator control is moved, a voltage proportional to its position is produced by inductive sensory apparatus 10, and is used to control a voltage controlled resistive element, the speed of machinery, or in any application that may be controlled by a variable DC voltage or microcontroller. Another application of inductive sensory apparatus 10 with triangular sense coil 100 includes detecting the position of a conductive object with high resolution, i.e., where a continuum of positions must be detected, rather than just a series of discrete positions. Of course, numerous other applications of inductive sensory apparatus 10 with triangular sense coil 100 may be achieved without departing from the spirit or scope of the invention.

The present invention may be embodied in other specific forms without departing from the spirit of the essential attributes thereof. therefore, the illustrated embodiments should be considered in all respects as illustrative and not restrictive, reference being made to the appended claims rather than to the foregoing description to indicate the scope of the invention.

What is claimed:

1. An inductive sensory system for identifying or detecting a conductive object or a conductively coded object, said inductive sensory system comprising:

a first sense inductor;

a second sense inductor used as a reference;

an oscillator connectable to said first sense inductor and to said second sense inductor; and a feedback control loop, wherein upon said oscillator being connected to said second sense inductor said feedback control loop establishes a fixed reference level; and a comparator, wherein upon said oscillator being connected to said first sense inductor, a state of said first sense inductor is compared by said comparator against a threshold derived from said fixed reference level to determine the change in inductance of said first sense inductor.

2. The inductive sensory system of claim 1, further comprising a processor, wherein said processor selects between said first sense inductor and said second sense inductor for connection to said oscillator.

3. The inductive sensory system of claim 1, wherein said feedback control loop maintains said fixed reference level substantially independent of a variation selected from the group consisting of: ambient temperature variations, supply voltage variations in a supply voltage to said inductive sensory system, and component tolerance variations in a component of said inductive sensory system.

4. The inductive sensory system of claim 1, wherein said conductively coded object is selected from a group consisting of: a plurality of cards, pictures, molded figures or shapes, game pieces, vehicles, and puzzle pieces.

5. The inductive sensory system of claim 1, wherein said first sense inductor comprises a flat sense coil and wherein said flat sense coil is embedded within an object, said object selected from a group consisting of: a book and a template positionable beneath a book, and wherein said conductive object comprises a page within said book.

6. The inductive sensory system of claim 5, wherein said conductive object comprises a plurality of pages within said book and wherein each of said plurality of pages includes a conductive material, and wherein each of said conductive material is offset on said page from a conductive spot on the next proximate page.

7. The inductive sensory system of claim 1, wherein said first sense inductor comprises a flat triangular sense coil or a rectangular sense coil.

8. The inductive sensory system of claim 7, wherein said triangular or said rectangular sense coil has an axis and wherein said inductive sensory system detects the position of said conductive object along said axis.

9. The inductive sensory system of claim 8, wherein said inductive sensory system is implemented within an attenuator or slide controller, wherein said conductive object comprises an adjustable bar or knob that slides over said triangular or rectangular sense coil to produce a control signal.

10. The inductive sensory system of claim 9, wherein said control signal is suitable for controlling audio volume, motor speed or temperature.

11. An inductive sensory system for identifying or detecting a conductive object or a conductively coded object, said inductive sensory system comprising:

a first sense inductor;

a second sense inductor used as a reference;

an oscillator connectable to said first sense inductor and said second sense inductor; and a comparator, wherein upon said oscillator being connected to each of said first and second sense inductors, a state of said first sense inductor is compared by said comparator against a plurality of thresholds derived from a state established by said second sense inductor to determine the change in inductance in said first sense inductor.

12. The system of claim 11, wherein the comparison of said state of said first sense inductor against said plurality of thresholds enables said inductive sensory system to detect multiple conductive states in said conductive object.

13. The system of claim 11, wherein said first sense inductor is used to detect a plurality of conductive objects at a given sensing distance independent of the orientation of said plurality of conductive objects.

14. The system of claim 13, wherein each of said plurality of conductive objects is encoded to exhibit a different conductivity, said plurality of conductive objects encoded according to a manner of encoding selected from a group consisting of a material encoding and a printed pattern encoding.

15. The system of claim 12, wherein said conductive object is encoded with a trinary pattern and wherein said inductive sensory system detects three distinct conductive states.

16. The system of claim 15, wherein said three distinct conductive states are selected from a group consisting of: a state of being covered with a conductive material, a state being uncovered by a conductive material, and a state of being partially covered with a conductive material.

17. The system of claim 13, wherein said plurality of conductive objects comprise a plurality of game pieces and wherein said first sense inductor is incorporated in a game board.

18. The system of claim 13, wherein said plurality of conductive objects comprise a plurality of molded objects and wherein said sense inductor is incorporated in the base of a playset or mat upon which said molded objects are placed.

19. The system of claim 13, wherein said first sense inductor is incorporated in a doll, soft toy, puzzle, vehicle, or card reader.

20. The system of claim 11, further comprising a feedback control loop, wherein upon said oscillator being connected to said reference sense inductor said feedback control loop establishes a fixed reference level.

* * * * *